(12) United States Patent
Maouche et al.

(10) Patent No.: US 10,316,590 B2
(45) Date of Patent: Jun. 11, 2019

(54) DRILL BIT APPARATUS TO CONTROL TORQUE ON BIT

(71) Applicant: HALLIBURTON ENERGY SERVICES, INC., Houston, TX (US)

(72) Inventors: Zakaria Maouche, Dubai (AE); Zeinoun Klink, Dubai (AE)

(73) Assignee: Halliburton Energy Services, Inc., Houston, TX (US)

( * ) Notice: Subject to any disclaimer, the term of this patent is extended or adjusted under 35 U.S.C. 154(b) by 663 days.

(21) Appl. No.: 14/433,434

(22) PCT Filed: Oct. 10, 2013

(86) PCT No.: PCT/US2013/064280
§ 371 (c)(1),
(2) Date: Apr. 3, 2015

(87) PCT Pub. No.: WO2014/059106
PCT Pub. Date: Apr. 17, 2014

(65) Prior Publication Data
US 2015/0233185 A1    Aug. 20, 2015

(30) Foreign Application Priority Data
Oct. 11, 2012  (GB) .................................. 1218304.2

(51) Int. Cl.
*E21B 10/43* (2006.01)
*E21B 10/567* (2006.01)
(Continued)

(52) U.S. Cl.
CPC .............. *E21B 10/43* (2013.01); *B24D 3/001* (2013.01); *B24D 18/00* (2013.01); *E21B 10/55* (2013.01);
(Continued)

(58) Field of Classification Search
CPC .. E21B 10/43; E21B 10/567; E21B 2010/425; E21B 10/55; E21B 10/5673; B24D 3/001; B24D 18/00
See application file for complete search history.

(56) References Cited

U.S. PATENT DOCUMENTS

| | | |
|---|---|---|
| 4,889,017 A | 12/1989 | Fuller et al. |
| 5,467,836 A | 11/1995 | Grimes et al. |

(Continued)

FOREIGN PATENT DOCUMENTS

| | | |
|---|---|---|
| EP | 0687797 | 12/1995 |
| EP | 0741228 | 11/1996 |

(Continued)

OTHER PUBLICATIONS

International Search Report and Written Opinion received for Patent Application No. PCT/US2013/064280, 18 pages, dated Apr. 23, 2015.

(Continued)

*Primary Examiner* — Matthew R Buck
(74) *Attorney, Agent, or Firm* — Baker Botts, L.L.P.

(57) ABSTRACT

In accordance with some embodiments of the present disclosure, a drill bit for drilling a wellbore in a subterranean formation comprises a plurality of cutters disposed at a contact face of the drill bit. Each of the cutters has a cutting face arranged to cut into the formation when the drill bit is rotated about an axis of rotation passing through the contact face during drilling of the wellbore. At least one of the cutters located inside a gauge portion of the drill bit is machine to form a substantially flat surface that intersects with the cutting face of the cutting and defines a cutting edge of the cutting face of the cutter.

30 Claims, 6 Drawing Sheets

(51) Int. Cl.
  *E21B 10/55* (2006.01)
  *B24D 3/00* (2006.01)
  *B24D 18/00* (2006.01)
  *G06F 17/50* (2006.01)
  *E21B 10/42* (2006.01)

(52) U.S. Cl.
  CPC ........ *E21B 10/567* (2013.01); *E21B 10/5673* (2013.01); *G06F 17/50* (2013.01); *E21B 2010/425* (2013.01)

(56) References Cited

U.S. PATENT DOCUMENTS

| | | | | |
|---|---|---|---|---|
| 6,065,553 | A * | 5/2000 | Taylor | E21B 10/43 175/428 |
| 6,068,071 | A * | 5/2000 | Jurewicz | E21B 10/567 175/432 |
| 6,123,160 | A * | 9/2000 | Tibbitts | E21B 10/26 175/385 |
| 6,164,394 | A * | 12/2000 | Mensa-Wilmot | E21B 10/43 175/331 |
| 6,164,395 | A * | 12/2000 | Fuller | E21B 10/55 175/431 |
| 6,604,588 | B2 * | 8/2003 | Eyre | E21B 10/5673 175/374 |
| 6,879,947 | B1 * | 4/2005 | Glass | E21B 10/00 175/48 |
| 6,904,983 | B2 * | 6/2005 | Thigpen | E21B 10/5673 175/428 |
| 7,096,978 | B2 | 8/2006 | Dykstra et al. | |
| 7,726,419 | B2 * | 6/2010 | Cruz | E21B 10/36 175/415 |
| 7,827,014 | B2 * | 11/2010 | Chen | E21B 7/04 367/82 |
| 9,097,075 | B2 * | 8/2015 | Lin | E21B 10/5676 |
| 2012/0186879 | A1 | 7/2012 | Durairajan et al. | |
| 2016/0249309 | A1 | 8/2016 | Kwon et al. | |

FOREIGN PATENT DOCUMENTS

| | | |
|---|---|---|
| GB | 2317632 | 4/1998 |
| GB | 2323398 | 9/1998 |
| GB | 2440448 | 1/2008 |

OTHER PUBLICATIONS

Office Action received for Chinese Patent Application No. 201380056428.1, dated Jan. 22, 2016; 17 pages.
Office Action received for Chinese Patent Application No. 201380056428.1, dated Oct. 8, 2016; 13 pages.
Office Action received for Chinese Patent Application No. 201380056428.1, dated Apr. 19, 2017; 8 pages.
Office Action received for Canadian Patent Application No. 2,887,906, dated May 17, 2016; 4 pages.
Office Action received for Canadian Patent Application No. 2,887,906, dated Mar. 14, 2017; 4 pages.
International Preliminary Report on Patentability, Application No. PCT/US2013/064280, 13 pages, dated Apr. 23, 2015.
Office Action for Canadian Patent Application No. 2,887,906, dated Dec. 8, 2017; 8 pages.
Office Action for Chinese Patent Application No. 201380056428.1, dated Jan. 5, 2018; 8 pages.
Office Action for Chinese Patent Application No. 201380056428.1, dated Feb. 26, 2019, no English translation; 4 pages
Office Action for Great Britain Patent Application No. GB1218304.2, dated Mar. 14, 2019; 5 pages.

* cited by examiner

DRILL BIT APPARATUS TO CONTROL TORQUE ON BIT

RELATED APPLICATIONS

This application is a U.S. National Stage Application of International Application No. PCT/US2013/064280 filed Oct. 10, 2013, which claims foreign priority to Great Britain Application No. 1218304.2 filed Oct. 11, 2012, the contents of which are hereby incorporated by reference in their entirety.

FIELD OF THE INVENTION

The present invention relates to a drill bit for drilling a wellbore in a subterranean formation, to a method for designing such a drill bit, and to an associated method of drilling a wellbore in a subterranean formation.

BACKGROUND

It is well known to provide non-linear subterranean well bores by way of directional drilling. When carrying out directional drilling, fluctuations in the weight-on-bit (WOB) and resulting fluctuations in the torque-on-bit (TOB) can cause the orientation of the drill bit and/or the associated steering assembly to change, taking the well bore away from its intended path. As a result, corrective steering has to be done in order to bring the well bore back to the intended path. The more frequently this deviation and corrective steering occurs, the less straight and more tortuous the well bore becomes. A more tortuous well bore makes it harder to effectively transfer the apparent WOB applied at the surface along the drill string to the drill bit, due to engagement or interaction between the drill string and the side wall of the well bore, and makes it harder subsequently to drill further or to run tools, casing and the like along the well bore.

A steerable bottom hole assembly (BHA) for directional drilling typically employs a fixed cutter drill bit (also known as a drag bit), in combination with a steering assembly. The BHA or steering assembly may also include equipment for detecting and measuring the tool position and orientation, such as a measuring-while-drilling (MWD) tool. Downhole motors are also often employed between the steering assembly and the drill bit, such as the so-called Moineau motors which are driven by the flow of drilling mud used in drilling operations.

A fixed cutter drill bit typically includes a bit body formed with several blades arranged around the longitudinal axis of the bit body, and a plurality of super-abrasive cutters, such as polycrystalline diamond compact (PDC) or thermally stable PCD (TSP) cutters, mounted on the blades so as to engage with and cut into the rock formation being drilled as the bit body is rotated. PDC cutters are most usually formed as a disc-shaped diamond table to act as a cutting face and supported on a cylindrical tungsten carbide (WC) substrate. The cutters are most often mounted on the blades of the bit body by brazing the cutters into pockets formed in the blades.

Junk slots are formed between the blades, with nozzles formed near the apex of each junk slot, so that drilling mud can be circulated from the surface, along passages in the drill string, out of the nozzles, and back up to the surface along the annulus between the drill string and the side wall of the well bore. This circulating fluid cools the drill bit and cutters, and carries the rock cuttings cut by the rotating cutters up to the surface, where the drilling mud is filtered to remove the cuttings and re-circulated.

When drilling a well bore, it is normally desirable to achieve a high rate of penetration (ROP), i.e., the distance drilled into the rock per unit time. To obtain a high rate of penetration, it is desirable to increase the rate of rotation of the drill bit and the volume of rock cut and removed with each rotation of the drill bit. Accordingly, fixed cutter drill bit designs seek to increase the total area of engagement between the cutting faces of the cutters and the rock formation, so as to increase the volume of rock being removed with each rotation of the drill bit, as well as employing advanced hydraulic design of the nozzles, blades and junk slots to ensure that sufficient fluid is circulated to cool the cutters and carry the cuttings away.

The cutters are typically distributed along the front and outer edges of the blades so that the radial positions of the cutters on the several blades vary as between each blade, so that the volumes of revolution defined by the plurality of cutters as the blades rotate overlap. In this way, each cutter is offset from every other cutter, so that it will cut virgin rock as it rotates and not merely track another cutter at the same radial position, and the plurality of cutters on the several blades between them obtain a substantially unbroken coverage across the rock face at the bottom of the well bore being drilled.

One feature of such designs is the depth to which each cutter is intended to cut into and engage with the rock face. By increasing the weight-on-bit (WOB), the cutters will be pushed deeper into the rock face, thereby increasing the depth-of-cut (DOC); however, with increased engagement of the cutters into the rock face, there is an attendant increase in the TOB that must be applied to rotate the drill bit, to overcome the reactive torque which the rock face imparts to the drill bit as the teeth engage with it. Similarly, increasing the DOC increases the work that each cutter must do, the amount of heat generated by the cutters, and the volume of cuttings that must carried away.

In this way, it can be understood that an increase in the depth of engagement of the cutters into the rock formation will lead to a corresponding increase in the reactive torque. An increase in the depth of engagement of the cutters into the rock face may occur, for example, either as a result of an increase in the WOB or due to the drill bit encountering a reduction in the compressive rock strength of the formation at the rock face, such as when moving into a zone of a different rock type. (Unless otherwise stated or dictated by context, references herein to the compressive rock strength refer to the confined compressive rock strength.)

The resulting fluctuations in the TOB, as noted above, are liable to cause the contact face (tool face) of the drill bit to jump or twist out of proper orientation and engagement with the rock face, and so misalign the drill bit and/or the associated steerable BHA with respect to the intended path of the well bore. Equally, if the cutters become over-engaged with the rock formation being drilled, the volume of cuttings being removed may exceed the capacity of the circulating drilling mud to clear the cuttings away from the cutters and junk slots, leading to so-called bit balling. Alternatively, the reactive torque on the bit may simply become too great for the associated downhole motor to continue to turn the bit, causing the bit to stall, or even so large as to damage the cutters, drill bit or other components of the BHA.

Variations in the compressive strength of the rock formation being drilled occur naturally, and the drilling operator may attempt to compensate for these by making corresponding adjustments to the WOB. Nevertheless, these adjustments will often lag the actual transition of the drill bit from one rock type to the next.

Furthermore, it is usually not possible in practice, in directional drilling, to transfer all of the apparent WOB applied at the surface all the way to the drill bit, due to the contact which occurs between the drill string and the well bore side wall. This can result in a phenomenon known as "stick and slip", where some part of the drill string, such as a stabilizer, catches on the side wall of the well bore as it navigates the curved path of the well bore, causing the drill string to stick in place and partially resist the applied WOB. A reduced WOB is then apparent at the tool face. When the stuck part of the drill string is then dislodged, for example as the stabilizer clears a bend in the well bore, the resistance to the applied WOB suddenly drops, and the apparent WOB at the tool face experiences a corresponding sudden increase. In addition to this, the problem may also be aggravated by drill string bounce, which is a similar phenomenon whereby the elasticity of the drill string causes erratic variation of the apparent WOB applied to the drill bit, with consequent over-engagement of the cutters.

Various approaches have been taken in the past in order to attempt to mitigate the above-mentioned problems, in particular by limiting or controlling the depth-of-cut (DOC) of the cutters into the formation. More specifically, various techniques have been used in order to try to prevent the cutters from over-engaging with the rock face when the WOB tends to force the cutters too deeply into the formation being drilled.

One technique is to use a variety of depth-of-cut control (DOCC) features to limit the DOC to a nominal maximum. The three main types of DOCC features can be summarised as follows.

The first type of DOCC features are a variety of structures or protrusions immediately trailing or preceding the PDC cutters (with respect to the intended direction of bit rotation) to protect the cutters or their mounting structures. Structures rotationally trailing the PDC cutters are disclosed, for example, in U.S. Pat. Nos. 4,889,017; 4,991,670; 5,244,039; and 5,303,785. Structures rotationally preceding the PDC cutters are disclosed, for example, in U.S. Pat. Nos. 3,153, 458; 4,554,986; 5,199,511; and 5,595,252. These structures seek to limit the exposure of the associated PDC cutters by coming into contact the rock face behind the cutters, thereby limiting the maximum DOC to the height that the cutter extends beyond the protrusion. However, when used alone, these DOCC features may be prone to suffer relatively large variations in the maximum DOC when either the DOCC structure or the cutter itself becomes worn by abrasion against the rock face. When the DOCC structure is worn relative to the cutter, the DOC will increase, with the attendant problems noted above. When the cutter is worn relative to the DOCC structure, the maximum DOC is reduced, which may result in a reduced ROP for the cutter.

The second type of DOCC feature is a relatively deep cutter pocket formed on the bit body, so that the cutters effectively become partially buried when they are fixed into the cutter pockets, thereby limiting the exposure of the cutters. This may have a similar effect to the provision of trailing or preceding structures of the first DOCC feature type, but may render the drill bit less adaptable for drilling formations of different, relatively hard or soft, rock types, and will tend to restrict design freedom as regards the orientation and placement of cutters on the bit body.

The third type of DOCC feature, as disclosed in U.S. Patent Application Publication No. US 2006/0278436 A1, is a bearing surface structure located rotationally in advance of the PDC cutters and arranged to transfer the WOB directly to the rock face once the associated cutters have become engaged up to the maximum DOC. The cutters will then not exceed the maximum DOC, unless the WOB applied through the bearing surface is sufficient to exceed the compressive rock strength of the formation. To prevent this, the total area of the bearing surfaces must be designed to be sufficiently large to distribute the WOB without exceeding the compressive rock strength for the formation which it is intended to drill. However, the need to provide a sufficiently large bearing surface area can place unfavourable constraint on the bit design, including the design of the blades and cutter placement, and may also have a negative impact on the hydraulic behaviour of the drilling fluid in the junk slots and at the interface between the drill bit and the rock face being drilled. These constraints may be exacerbated for drill bits intended for drilling relatively soft (low compressive strength) rock formations, or for relatively small diameter drill bits.

Another related technique to control the DOC is to mount some or all of the cutters to the bit body with a less aggressive angle or orientation relative to the cutting direction of the cutter as the drill bit rotates. Cutter aggressiveness is a measure of the degree to which a cutter will tend to bite into the rock face, as opposed to tending to push away from the rock face as the bit rotates. By mounting cutters so that they have a positive or forward rake, they will tend to dig into the rock face (effectively pulling the bit into the rock as they cut it), thereby tending to remove more formation material and generating a higher reactive torque. Cutters mounted with a positive rake angle are thus more aggressive. Cutters with a negative rake angle, or backrake, tend to push away from the formation, trying to slide over it rather than cutting through it, and so are less aggressive.

As will be self-evident, cutters mounted at an aggressive positive rake angle will be more prone to generate a large reactive torque as a result of a sudden increase in WOB, whereas cutters mounted with a backrake will tend to suffer less variation in the reactive torque as a result of fluctuations in the WOB. Backraked cutters have thus been used, particularly for steerable drill bits, in order to make the drill bit less susceptible to WOB fluctuations. However, cutters with a significant back rake angle have been found not to be effective for drilling through softer (low compressive strength) rock formations. In order to try to achieve a balance between ROP and behaviour of the bit under WOB fluctuations, bits using cutters having a mixture of positive, negative and/or neutral backrake angles have been suggested, for example in U.S. Pat. No. 5,314,033.

As can be appreciated from the foregoing, it would be desirable to provide a drill bit design solution, in particular for directional drilling, that will mitigate the undesirable response tendencies of the drill bit to fluctuations in WOB, while preserving design freedom and maintaining acceptable WOB, ROP and hydraulic performance capability of the drill bit.

Each of the aforementioned published patents and patent applications is hereby incorporated herein in its entirety.

SUMMARY OF THE INVENTION

According to the present invention, there is provided a drill bit for drilling a wellbore in a subterranean formation, the drill bit comprising: a plurality of cutters disposed at a contact face of the drill bit, each of the cutters having a cutting face arranged to cut into the formation when the drill bit is rotated about an axis of rotation passing through the contact face during drilling of the wellbore, wherein at least one of the cutters located inside a gauge portion of the drill bit is machined to form a substantially flat surface which intersects with the cutting face of the cutter and defines a cutting edge of the cutting face of the cutter.

In embodiments of the drill bit, the at least one cutter having said substantially flat surface is located in a central region of the contact face adjacent to where the axis passes through the contact face.

Embodiments of the drill bit may include a bit body having one or more blades arranged to rotate about said axis of rotation, the plurality of cutters being disposed on said one or more blades. Here, shoulder portions of the one or more blades may extend forward in the direction of said axis from the radially outermost gauge portion of the drill bit to define forward-most nose portions of the one or more blades, with an inner cone portion extending backward from the nose portions. In this case, the at least one cutter having said substantially flat surface may be located in at least the inner cone portion. Furthermore, at least one more of the cutters in at least a nose portion or a shoulder portion of at least one of the blades may also be machined to form a substantially flat surface which defines a cutting edge of the cutting face of the one more cutter.

In further embodiments of the drill bit, the at least one cutter having said substantially flat surface is mounted on the drill bit with said substantially flat surface facing substantially in a forward drilling direction along said axis of rotation.

In still further embodiments of the drill bit, the at least one cutter having said substantially flat surface is mounted on the drill bit with said substantially flat surface lying substantially parallel to said contact face of the drill bit.

In yet further embodiments of the drill bit, the substantially flat surface of the at least one cutter locally defines the contact face of the drill bit.

In even further embodiments of the drill bit, the contact face of the drill bit is the portion of the surface of the drill bit which comes into contact with the rock face of the subterranean formation at the un-drilled bottom surface of the wellbore being drilled.

In still even further embodiments of the drill bit, the substantially flat surface of each said at least one cutter is arranged to act as a bearing surface to control the depth of cut of the cutter in a subterranean rock formation during drilling.

In yet still further embodiments of the drill bit, the at least one cutter includes two or more cutters each machined to have respective substantially flat surfaces which intersect with the cutting faces of the cutters and define the cutting edges of the cutting faces of the two or more cutters. Here, the substantially flat surfaces of the two or more cutters may be arranged so as to cooperate to act as a bearing surface to control the depth of cut of those cutters in a subterranean rock formation during drilling. Moreover, the substantially flat surfaces of the two or more cutters may be formed at different angles of inclination relative to the respective cutting faces of the two or more cutters. Furthermore, the substantially flat surfaces of the two or more cutters may have different surface areas. Additionally, the two or more cutters having said substantially flat surfaces may be disposed at the contact surface of the drill bit for the respective cutting faces of the cutters to engage the rock face of the subterranean formation at the un-drilled bottom surface of the wellbore being drilled at different angles of inclination with respect to the cutting direction of each cutter as the drill bit is rotated during drilling.

In even yet further embodiments of the drill bit, the machined substantially flat surface is formed by grinding or cutting material from a cutter selected from the group consisting of: a PDC cutter; a TSP cutter; and other superabrasive cutters.

In still yet even further embodiments of the drill bit, at least one further cutter of the plurality of cutters is located inside the gauge portion of the contact face and is formed without a machined substantially flat surface defining the cutting edge of the cutting face of the cutter. Here, the at least one further cutter may be disposed inside the gauge portion of the contact face at an angle of inclination with respect to the cutting direction of the further cutter as the drill bit is rotated during drilling so as to exhibit a more aggressive cutting behaviour than the at least one cutter having said substantially flat surface.

Embodiments of any of the foregoing drill bits may comprise one or more depth-of-cut control features formed at the contact face of the drill bit, selected from the group consisting of: one or more protrusions located at the contact face rotationally in advance of or behind one or more of the plurality of cutters in the cutting direction of the cutter so as to limit the exposure of the cutter and hence limit the depth-of-cut of the cutter into the rock face of the subterranean formation at the un-drilled bottom surface of the wellbore being drilled; one or more bearing surfaces located at the contact face and arranged proximate one or more of the cutters to transmit the weight-on-bit directly to the rock face of the subterranean formation at the un-drilled bottom surface of the wellbore being drilled if the weight-on-bit causes the depth-of-cut of one or more associated ones of the plurality of cutters to exceed a predetermined maximum depth-of-cut for those cutters into the rock face; and one or more of the plurality of cutters being disposed in a recessed pocket at the contact face of the drill bit so as to limit the exposure of the cutter beyond the material from which the pocket is formed and hence limit the depth-of-cut of the cutter into the rock face of the subterranean formation at the un-drilled bottom surface of the wellbore being drilled.

In additional embodiments of the drill bit, said at least one cutter that is machined to form a substantially flat surface which defines a cutting edge of the cutting face of the cutter is substantially cylindrical in shape, except for said machined substantially flat surface.

In further additional embodiments of the drill bit, each of the plurality of cutters is disposed at the contact face of the drill bit with its cutting face arranged to cut into the formation to a nominal or maximum depth when the drill bit is rotated about the axis of rotation for a predetermined applied WOB in a formation of a predetermined compressive rock strength, the cutters being arranged such that the nominal or maximum depth-of-cut is relatively small for cutters located centrally on the contact face substantially adjacent to where the axis passes through the contact face, and is relatively large for cutters located in a region of the contact face surrounding the centrally located cutters and inside the gauge portion of the drill bit.

In yet further additional embodiments of the drill bit, the at least one cutter having said substantially flat surface is disposed at the contact face as part of one or both of a primary cutting structure and a secondary cutting structure.

According to a second aspect of the present invention, there is provided a steerable bottom hole assembly for directional drilling comprising a drill bit according to the first aspect of the invention.

According to a third aspect of the present invention, there is provided a directional drilling apparatus comprising a drill string and a steerable bottom hole assembly according to the second aspect of the invention.

According to a fourth aspect of the present invention, there is provided a method of designing a drill bit for drilling a wellbore in a subterranean formation comprising: specifying at least one contour corresponding to a contact surface of the drill bit and having a rotational axis of the drill bit passing therethrough; specifying the disposition of a plurality of cutters at the contact surface; and specifying at least one of the cutters located inside a gauge portion of the drill bit as being formed with a substantially flat surface which intersects with the cutting face of the cutter and defines a cutting edge of the cutting face of the cutter.

In embodiments of the method, the at least one cutter having said substantially flat surface is located in a central region of the contact face adjacent to where the axis passes through the contact face.

In further embodiments of the method, the orientation of said substantially flat surface is specified either as lying substantially parallel to said contact face of the drill bit and/or as facing substantially in a forward drilling direction along said axis of rotation.

In still further embodiments of the method, specifying at least one of the cutters includes specifying two or more of the cutters as being formed with substantially flat surfaces which intersect with the cutting faces of the cutters and define cutting edges of the cutting faces of the cutters, with the two or more cutters each being located inside the gauge portion of the drill bit.

Even further embodiments of the method comprise calculating the reactive torque which will act on the drill bit at one or more points along the intended path of the drill bit when drilling the wellbore. Here, calculating the reactive torque may be based at least in part on the surface area of the substantially flat surface or the length of the cutting edge of each of the at least one of the cutters formed to have said substantially flat surface. Moreover, such a method may further comprise providing formation characteristics data corresponding to the formation in which the wellbore is to be drilled, wherein said formation characteristics data includes, or is used to determine, at least the compressive rock strength of the formation at said one or more points along the intended path of the drill bit when drilling the wellbore. In this case, the formation characteristics data may be used, at least in part, to determine the depth of cut for the plurality of cutters at said one or more points along the wellbore. Such a method may further comprise increasing the surface area of the substantially flat face of one or more of the at least one of the cutters formed with a substantially flat face if the depth of cut is determined to exceed a maximum value specified for the depth of cut for any of the plurality of cutters at said one or more points along the wellbore.

Yet further embodiments of the method further comprise specifying one or more of the parameters selected from the group consisting of: the surface area of the substantially flat surface of said at least one of the cutters; the total surface area of all of the substantially flat surfaces of said at least one of the cutters; the angle of inclination of the substantially flat surface relative to the cutting face of said at least one of the cutters; the angle of the cutting face of said at least one of the cutters relative to the cutting direction of the at least one of the cutters as the drill bit rotates about the rotational axis; the orientation of the substantially flat surface of said at least one of the cutters relative to the axially forward direction of the drill bit; a dull grading value indicative of the relative sharpness of the cutting edge of said at least one of the cutters; the number of said at least one of the cutters; and the position of said at least one of the cutters at the contact face. Here, the method may further comprise adjusting at least one of the one or more parameters and directly or indirectly comparing a value indicative of at least one performance characteristic of the adjusted drill bit design and the unadjusted drill bit design. Moreover, said at least one performance characteristic may include one or more selected from the group consisting of: the reactive torque on bit generated at one or more points along the intended path of the drill bit when drilling the wellbore; the rate of penetration of the drill bit into the formation at one or more points along the intended path of the drill bit when drilling the wellbore; the ratio of torque-on-bit to weight-on-bit at one or more points along the intended path of the drill bit when drilling the wellbore; the variation of torque-on-bit with changes in the apparent weight-on-bit at one or more points along the intended path of the drill bit when drilling the wellbore; and the maximum, minimum or an average of the values indicative of any of these, or a performance factor based on one or more of these.

Embodiments of such a method may further comprise: either selecting the adjusted drill bit design or the unadjusted drill bit design based on said comparison; or further adjusting at least one of the one or more parameters and directly or indirectly comparing a value indicative of the at least one performance characteristic of the further adjusted drill bit design with one or more of the previous drill bit designs and either selecting between the available designs or repeating the processes of further adjusting and comparing until a design is selected.

In yet even further embodiments of the method, the method comprises simulating drilling the wellbore in the subterranean formation using the drill bit design.

According to a fifth aspect of the present invention, there is provided a method of designing a drill bit for drilling a wellbore in a subterranean formation comprising: specifying at least one contour corresponding to a contact surface of the drill bit and having a rotational axis of the drill bit passing therethrough; specifying the disposition of a plurality of cutters at the contact surface; and specifying at least two of the cutters at different positions on the contact face as each being formed with a substantially flat surface which intersects with the cutting face of the cutter and defines a cutting edge of the cutting face of the cutter.

Embodiments of this method further comprise evaluating the sharpness and/or aggressiveness of the at least two of the cutters formed with substantially flat surfaces and adjusting the relative sharpness and/or aggressiveness of said at least two of the cutters by adjusting one or more cutter parameters of one or more of the at least two of cutters, the cutter parameters being selected from the group consisting of: the surface area of the substantially flat surface; the angle of inclination of the substantially flat surface relative to the cutting face of the cutter; the angle of the cutting face of the cutter relative to the cutting direction of the cutters as the drill bit rotates about the rotational axis; the orientation of the substantially flat surface of the cutter relative to the axially forward direction of the drill bit; a dull grading value indicative of the relative sharpness of the cutting edge of said at least one of the cutters; the length of the cutting edge of the cutter; the position of said cutter at the contact face. Here, the method may further comprise assessing the distribution of the sharpness and/or aggressiveness of the plurality of cutters across the contact surface and adjusting one or more of the cutter parameters of one or more of the at least two of the cutters to obtain a desired distribution of the sharpness and/or aggressiveness of the cutters across the contact face.

In further embodiments of the method, the desired distribution includes providing cutters with a lower sharpness and/or aggressiveness near a central region of the contact face and cutters with a higher sharpness and/or aggressiveness outside the central region of the contact face.

Embodiments of either of the fourth or fifth aspects of the present invention may further comprise specifying the provision of one or more depth-of-cut control features at the contact face of the drill bit, selected from the group consisting of: one or more protrusions located at the contact face rotationally in advance of or behind one or more of the plurality of cutters in the cutting direction of the cutter so as to limit the exposure of the cutter and hence limit the depth-of-cut of the cutter into the rock face of the subterranean formation at the un-drilled bottom surface of the wellbore being drilled; one or more bearing surfaces located at the contact face and arranged proximate one or more of the cutters to transmit the weight-on-bit directly to the rock face of the subterranean formation at the un-drilled bottom surface of the wellbore being drilled if the weight-on-bit causes the depth-of-cut of one or more associated ones of the plurality of cutters to exceed a predetermined maximum depth-of-cut for those cutters into the rock face; and one or more of the plurality of cutters being disposed in a recessed pocket at the contact face of the drill bit so as to limit the exposure of the cutter beyond the material from which the pocket is formed and hence limit the depth-of-cut of the cutter into the rock face of the subterranean formation at the un-drilled bottom surface of the wellbore being drilled. Here, the one or more depth-of-cut control features may be arranged to control the depth of cut of the plurality of cutters at the contact face of the drill bit so as to provide a desired distribution of the maximum permitted depth of cut for the plurality of cutters across the contact face. In such a case, the desired distribution of the maximum depth-of-cut for the plurality of cutters may include an increase in the maximum permitted depth of cut moving from the axis of rotation of the drill bit radially outwardly along the contact face. Furthermore, the desired distribution of the maximum depth-of-cut for the plurality of cutters may include an increase in the maximum permitted depth-of-cut moving from the outermost gauge portion of the drill bit radially inwardly along the contact face.

According to a sixth aspect of the present invention, there is provided a method of manufacturing a drill bit comprising: forming a bit body having a contact face of the drill bit including a gauge portion and an axis of rotation of the drill bit passing through the contact face; and mounting at least one cutter to the bit body at the contact face radially inside the gauge portion, said at least one cutter having a substantially flat surface which intersects with the cutting face of the cutter and defines a cutting edge of the cutting face of the cutter.

In embodiments of the method, the at least one cutter is selected from the group consisting of: a PDC cutter; a TSP cutter; and other super-abrasive cutters, wherein the substantially flat surface is formed by removing material from an original super-abrasive cutter prior to mounting it to the bit body. Here, it is possible that either the super-abrasive cutter is a dull cutter which has been worn by use to form said substantially flat surface, or the material has been removed by machining the original super-abrasive by grinding or cutting.

Further embodiments of the method further comprise machining an original cutter to form the at least one cutter having said substantially flat surface prior to mounting the at least one cutter to the bit body.

Still further embodiments of the method may further comprise selecting a dull cutter as said at least one cutter and mounting the selected dull cutter to the drill bit.

Embodiments of the present invention can provide a drill bit which resists the tendency for the cutters to over-engage the rock face as a result of fluctuations in the apparent WOB at the bit. Embodiments of the drill bit include cutters with machined flat surfaces that resist the tendency of the applied WOB to push the cutters deeper into the rock face.

Embodiments of the present invention can exhibit reduced TOB response to fluctuations in the WOB or changes in the compressive rock strength of the formation being drilled. Embodiments of the drill bit include a less aggressive cutter arrangement, reducing the tendency of the cutters to bite into the rock face under loading.

Embodiments of the present invention are able to display a substantial resistance to TOB fluctuation for no, or only marginal, reduction in the maximum ROP at acceptable levels of WOB. This allows a steady ROP to be maintained, even where fluctuations in the WOB or changes in the compressive rock strength of the formation being drilled occur.

Embodiments of the present invention are able to provide a drill bit that can maintain an acceptable ROP in soft (low compressive strength) rock formations.

Embodiments of the present invention can provide a drill bit with improved steerability. Embodiments of the drill bit are more stable in maintaining the desired orientation of the tool face and its engagement with the rock face, so as to maintain the drilling of a directional well bore on or closer to its intended path.

Embodiments of the present invention provide a drill bit that is suitable for use in directional drilling. Embodiments of the drill bit utilise less sharp and/or less aggressive cutters, or cutters with relatively shallow DOC, inside the gauge portion of the drill bit, and preferably within the central region of the tool face, thereby reducing the sensitivity of the drill bit to fluctuations in WOB and improving steerability and directional stability.

Embodiments of the present invention are able to resist the tendency of an increased WOB to increase the DOC of the cutters above nominal or maximum values without sacrificing freedom of design or compromising hydraulic performance. Embodiments of the drill bit are provided with machined flat surfaces which reduce or eliminate the need to allocate a substantial portion of the available surface area of the tool face to the provision of DOCC features such as bearing surfaces, thus preserving the maximum available area and design freedom for the drill bit, such as for shaping the blades and junk slots and positioning the nozzles of a fixed cutter drill bit.

Embodiments of the invention are able to design a drill bit specifically tailored for use in the subterranean formation in which the well bore is to be drilled. The drill bit can be designed to be able to drill through formations exhibiting changes in the compressive strength of the rock formation, and under the influence of varying apparent WOB at the drill bit, without suffering the above-noted deteriorations in drill bit performance, or with significantly reduced deterioration.

The drill bit can also be designed to achieve specified performance objectives, such as maintaining the DOC or ROP within predetermined limits for the subterranean formation in question.

Embodiments of the invention are also able to provide a drill bit which exhibits a reduced response to axial vibrations. Embodiments of the drill bit exhibit a maximum or cut-off value for the depth-of-cut of the cutters which is controlled by one or more DOCC features and prevents the cutters from engaging too deeply into the rock face in spite of increases in the apparent WOB at the drill bit due to the vibrational axial loading, thus damping the response of the cutters to such vibrations.

BRIEF DESCRIPTION OF THE DRAWINGS

To enable a better understanding of the present invention, and to show how the same may be carried into effect, reference will now be made, by way of example only, to the accompanying drawings, in which:—

DETAILED DESCRIPTION

Specific embodiments of the present invention will now be described with reference to the accompanying drawings.

Figure 1:
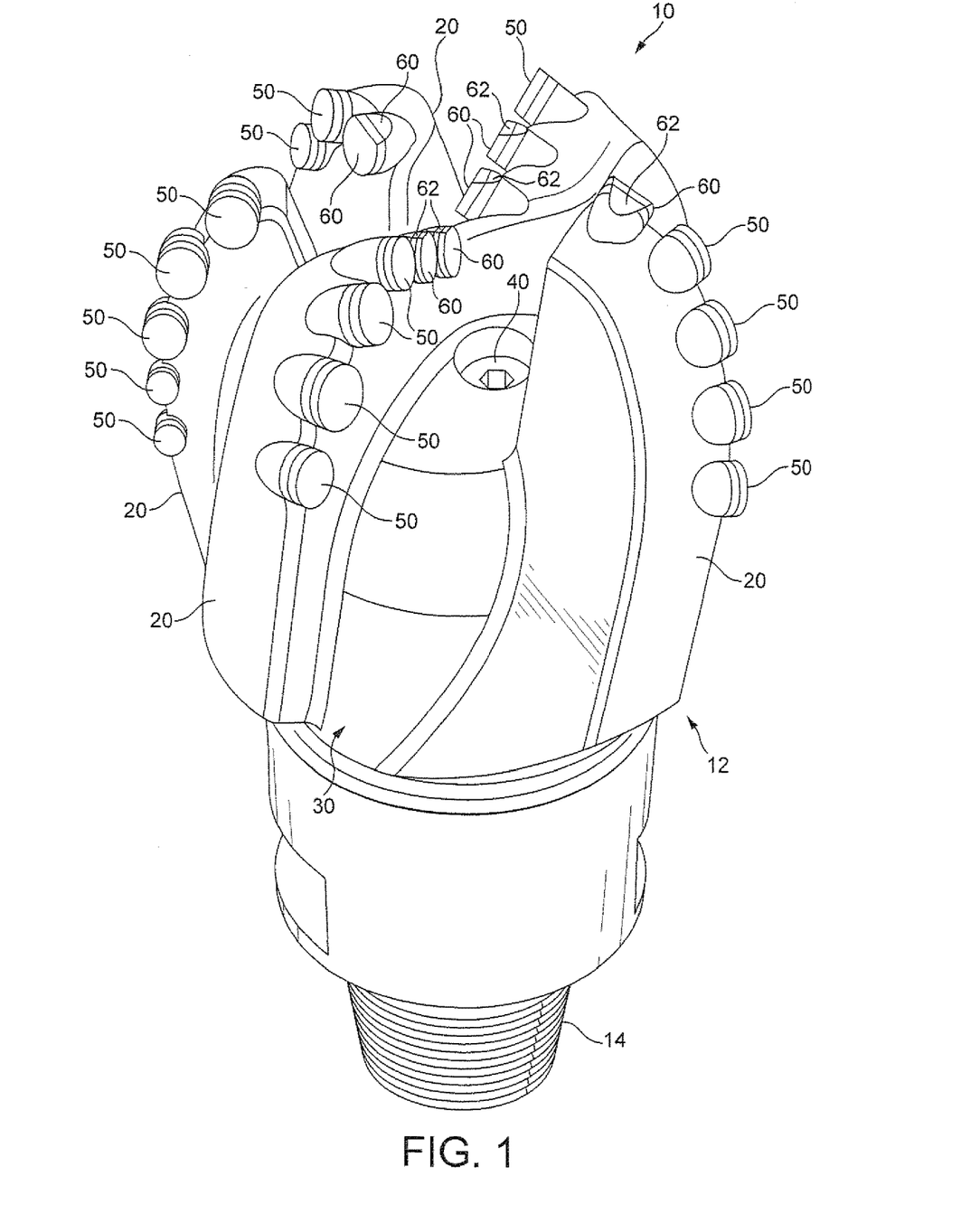
FIG. 1 shows a perspective view of one embodiment of a drill bit according to the present invention.

FIG. 1 shows an embodiment of a fixed cutter drill bit 10 according to the present invention.

This particular embodiment of the drill bit 10 includes a bit body 12 at one end, and has a threaded connection 14 at the opposite end, for connection the drill bit 10 at the end of a bottom hole assembly (BHA), drill string, or the like.

The bit body 12 is formed to have a plurality of blades 20, each extending up from a gauge portion to define curved shoulder portions and forward-most nose portions. As can be seen, three of the blades 20 terminate at or about the nose portions of the blades, whilst the remaining two blades continue radially inwardly and meet to define an inner cone of the blades in a central region of the front- or contact-face (tool face) of the drill bit.

Junk slots 30 are formed between each adjacent pair of blades 20, so as to define fluid channels along which drilling mud can be carried away from the contact face of the drill bit 10 during drilling of a wellbore. Nozzles 40 are provided on the drill bit body 12 in order to provide a flow of drilling mud along the drill string, out of the nozzles 40, and back up to surface level along the annulus surrounding the drill string, between the drill string and the wellbore sidewall. This flow of drilling mud carries the rock cuttings which are removed by the drill bit 10 away from the contact face of the drill bit via the junk slots 30, and carries them up the annulus to the surface, where the drilling mud is filtered to remove the rock cuttings, before being re-circulated.

As can be seen, a plurality of cutters 50 and 60 are mounted onto the blades 20 of the drill bit 10, at the contact face of the drill bit. Although not expressly shown in FIG. 1, these cutters 50 and 60 may extend further down the side edges of the blades, into the gauge portion, if desired.

As is shown illustratively in FIG. 1, the cutters 50 and 60 are superabrasive cutters, formed with a diamond table or similar structure mounted onto a supporting substrate, such as of tungsten carbide (WC). Such cutters include, for example, the PCD and TSP cutters mentioned above.

The cutters 50 are formed as complete-cylindrical cutters, being circular in cross-section and mounted into pockets formed on the blades 20 of the drill bit 10. PCD and TSP cutters are typically formed as circular cylindrical cutters, in order to manage the strain placed on the cutting structure, and in particular on the bond between the substrate and the diamond table, as a result of the high-pressure and high-temperature manufacturing techniques needed to produce such cutters. More recently, however, advanced techniques for forming the diamond table and substrate at high pressure end temperature have become available which permit a variety of shapes to be obtained, although these are not yet widely in use.

By contrast to cutters 50, each of the cutters 60 is formed not as a complete right-circular cylinder, but as such a cylinder having a cylindrical wedge removed from the end to which the diamond table is affixed. The resulting cutters 60 are thus formed in the shape of truncated cylinders, as is more readily seen in FIG. 5. The removal of the cylindrical wedge results in the formation of a substantially flat surface 62, on one side of the cutter 60, which flat surface faces in a direction determined by the orientation of the cutter 60 in its respective cutter pocket. As shown in FIG. 1, the substantially (or actually) flat surfaces 62 face substantially parallel to the local direction of the contact face of the blades where each of the cutters 60 is mounted. Equally, different orientations of the cutters 60 may be selected, for example so as to have the flat surfaces 62 oriented facing in the axially forward direction (drilling direction) of the drill bit 10.

Figure 2:
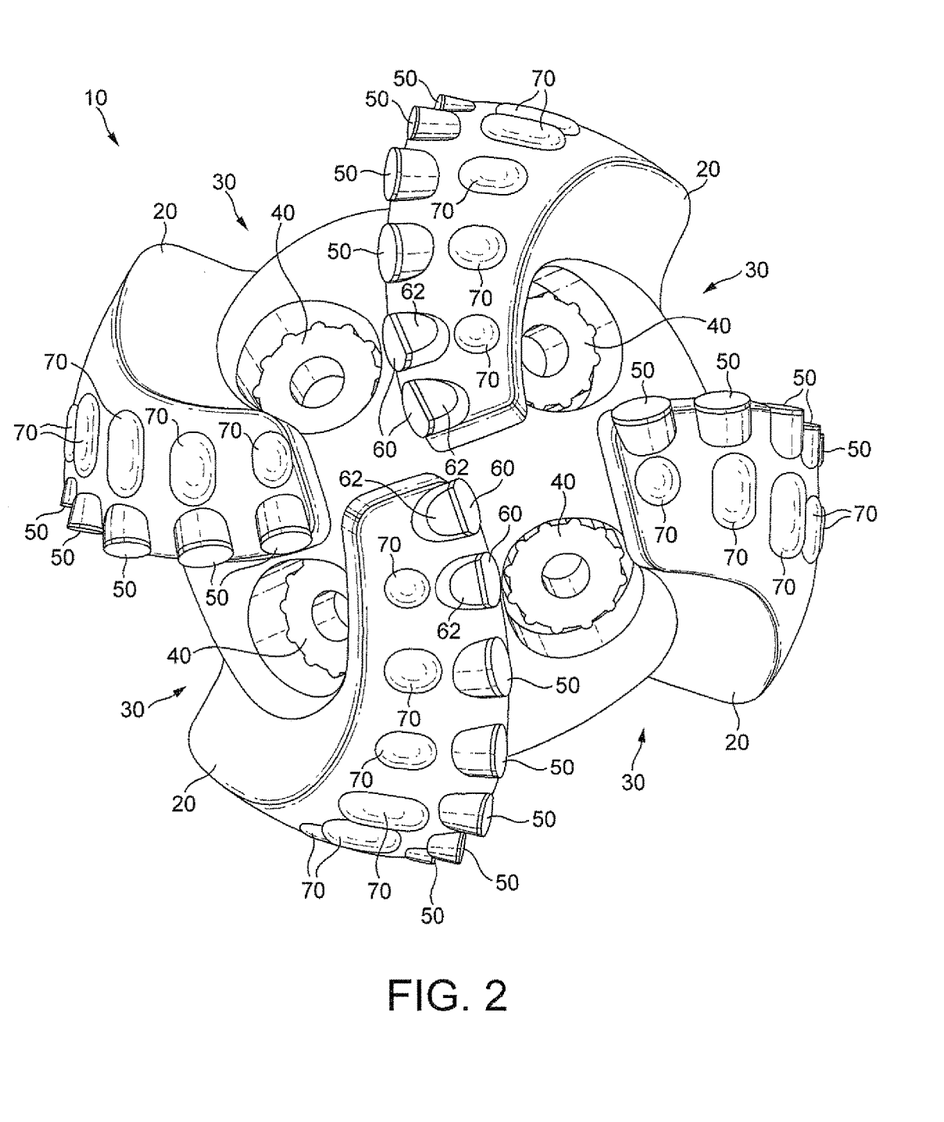
FIG. 2 shows an axial end view looking at the tool face of another embodiment of a drill bit according to the present invention.

An axial end view showing the contact face of a similar embodiment of a drill bit 10 according to the present invention is shown in FIG. 2. In this case, the bit body 12 is formed with only four blades 20, with four corresponding junk slots 30 and nozzles 40. Again, with the drill bit 10 of FIG. 2, only two of the blades 20 extend into the central region of the contact face, with the remaining two blades extending only as far as, or slightly beyond, the nose portion of each blade 20.

Again, the blades 20 are formed with a mixture of "sharp" cutters 50, which have a fully-circular cross-section, and "dull" cutters 60, which have a truncated-cylindrical shape, i.e., a cylindrical shape from which a cylindrical wedge has been removed at the cutting-face-end of each cutter 60, so as to form flat or substantially flat surfaces 62 facing substantially in the forward axial drilling direction of the drill bit 10.

The cutters 60 are referred to herein as "dull" cutters, as the removal of a cylindrical wedge to form each substantially flat surface 62 defines a relatively blunt cutting edge on the cutting face of each of the cutters 60. An extended, flat cutting edge formed in this manner, at the intersection of the cutting face (diamond table) and the substantially flat surface 62 is relatively less sharp than the cutting edges of the fully cylindrical cutters with circular cutting faces, of the "sharp" cutters 50.

A major difference between the embodiment of FIG. 1 and that of FIG. 2 is that the drill bit 10 of FIG. 2 is provided, on each of the blades 20, with a plurality of protrusions 70, which function as depth-of-cut control (DOCC) features, to limit the extent to which each of the cutters 50 and 60 will penetrate into the rock face during cutting. Although the specific example of protrusions 70 has been shown in FIG. 2, it will be appreciated that any of the aforementioned DOCC features can be applied to the embodiments of the present invention, including the provision of protrusions leading and/or trailing the cutters 50 and 60, the provision of bearing surfaces adjacent to and/or in-between the cutters 50 and 60, and the use of deep cutter pockets to limit the exposure (and cutting depth) of the cutting faces of the cutters 50 and 60. In the case of the embodiment of FIG. 2, it can be seen that the drill bit 10 is formed so as to rotate in the counter-clockwise direction as viewed in FIG. 2, and that the protrusions 70 are formed so as to be rotationally trailing with respect to the associated cutters 50 and 60.

What is common between the embodiments of FIGS. 1 and 2 is the provision of the dull cutters 60. As can be appreciated from these Figures, the dull cutters 60 are provided inside the gauge portion of the drill bit, predominantly in the central region of the contact face adjacent to the axis of rotation of the drill bit, this corresponding to the inner cone of the blade structure.

In this regard, the present inventors have appreciated that the stability and steerability of the drill bit 10 is influenced by the sharpness and/or aggressiveness of the cutters at the contact face inside the gauge portion of the drill bit, and is influenced most heavily by the behaviour of the cutters 50 and 60 in the inner cone region.

More specifically, it has been found that the behaviour of a drill bit in response to variations and fluctuations in the weight-on-bit (WOB) is particularly sensitive to the behaviour of the cutters 50 and 60 in the inner cone. Steerable drill bits are, in particular, sensitive to fluctuations in the WOB when the cutters 50 and 60 in the inner cone are disposed with a high level of aggressiveness. By contrast, less sharp cutters, or those formed with a back-rake, have been identified as being less susceptible to WOB fluctuations. Although, in the past, a solution to such sensitivity has been proposed, which is to provide the cutters in the inner cone with a neutral or negative rake (back rake), which can achieve the objective of reducing the sensitivity of the drill bit to fluctuations in WOB, such arrangements are typically unable to provide the desired rate of progress (ROP), in particular in softer rock formations. Embodiments of the present invention therefore employ a different technique for reducing the sensitivity of the drill bit 10 to fluctuations in WOB. Instead of reducing the aggressiveness of the cutter disposition in the inner cone, at least a portion of the cutters in the inner cone are instead provided as dull cutters 60, having pre-formed substantially flat surfaces 62, which define the cutting edge of the cutters 60 at the point of intersection with the cutting faces of the cutters 60. This has the dual effect, firstly, of blunting the cutters, so they are less sharp than fully cylindrical cutters 50 having circular cutting faces, and secondly of providing the substantially flat surfaces 62 which, of themselves, function as bearing surfaces acting to suppress the tendency of the dull cutters 60 to bite deeper into the rock face as the WOB is increased.

Figure 3A:
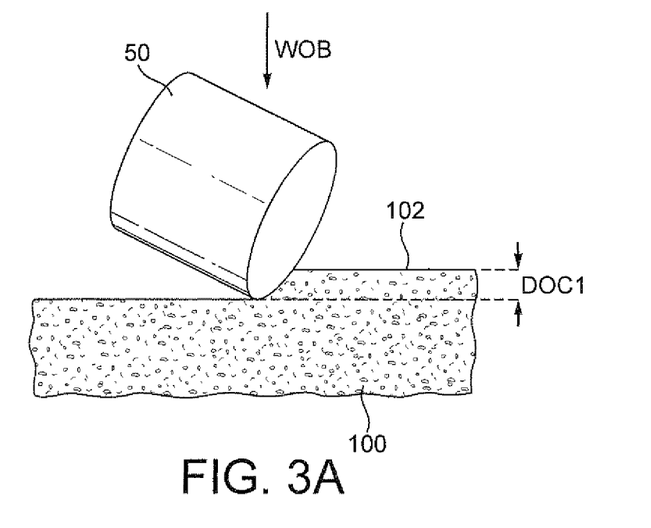
FIGS. 3A and 3B respectively show a sharp cutter without any flat surface formed at the cutting edge, and a dull cutter having a flat surface worn or machined to intersect with the cutting face of the cutter at the cutting edge.
Figure 3B:
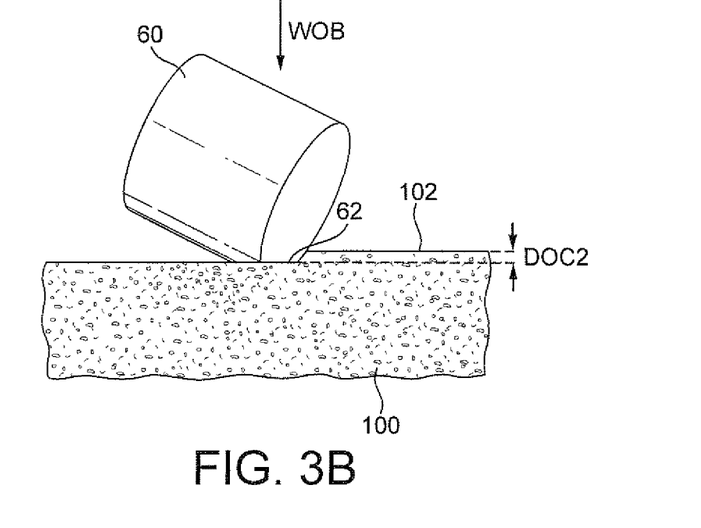

The effect of using such cutters is shown illustratively in FIGS. 3A and 3B, where it can be seen that, for two cutters 50 and 60 having essentially the same back rake angle (i.e. disposed with the same aggressiveness), the sharp cutter 50 will tend to bite deeper into the rock face, having a larger depth of cut (DOC1), as compared with the dull cutter 60, having the shallower depth of cut (DOC2).

The tendency of the dull cutter 60 to bite more deeply into the rock under increased weight on bit is suppressed, with the effect that there is a reduction in the usual corresponding increase in the reactive torque on bit, which would normally arise due to the cutters cutting more deeply into the formation and removing a larger volume of rock for each rotation of the drill bit 10.

Accordingly, it is believed that the dull cutters 60 can be utilised, advantageously, throughout substantially all of the tool face of the drill bit 10, in order to vary and control the cutter behaviour across the contact face of the drill bit 10.

Figure 4A:
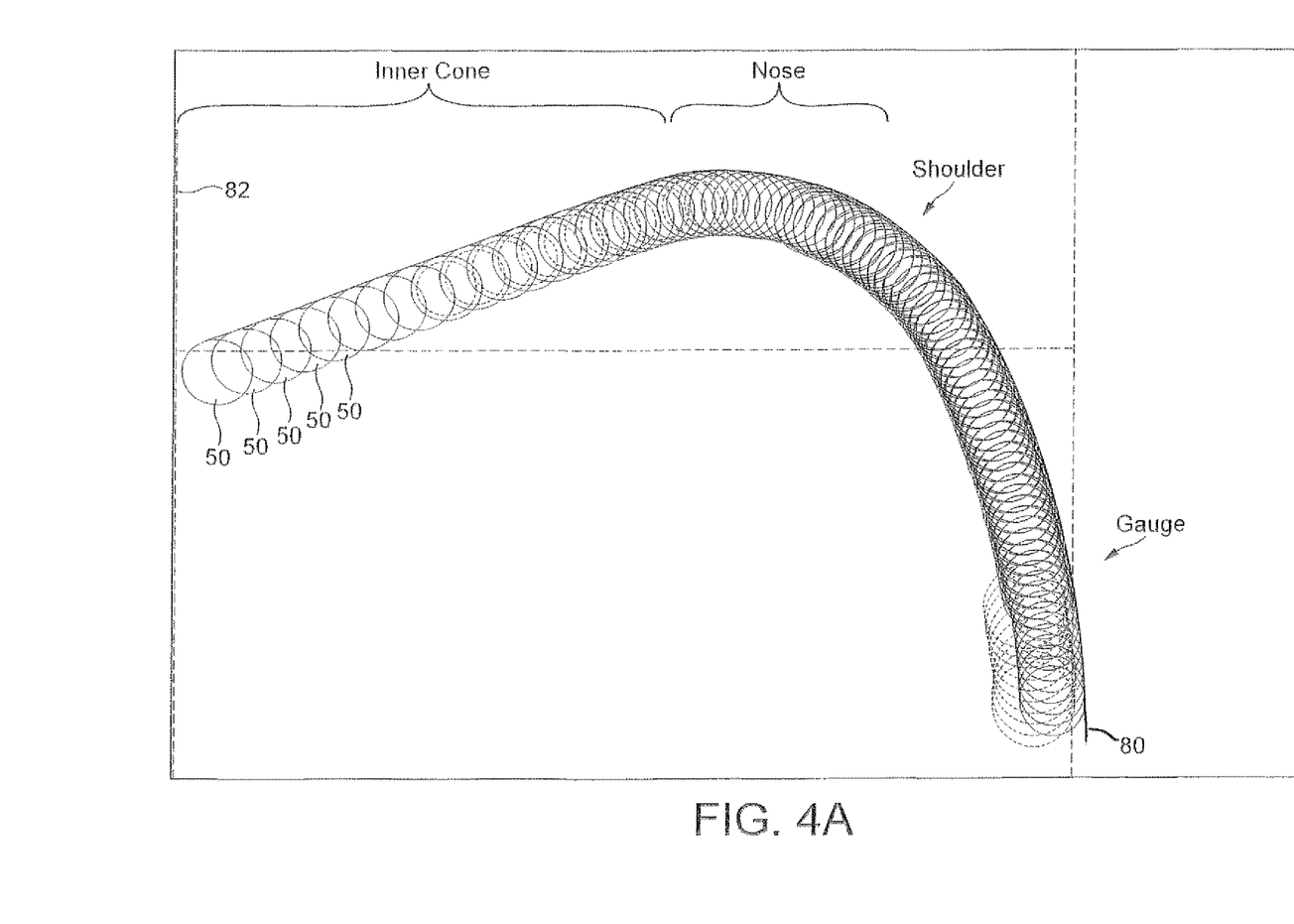
FIG. 4A shows a schematic illustration of the distribution of a plurality of cutters across the contact face of a drill bit, where one contour representative of the blade geometry at the contact face has the cutters from all blades super-imposed on top of one another to show how they are arranged across several blades to be distributed across the cutting face and will cooperate to drill into the rock face across substantially its whole surface area as the drill bit is rotated.

FIG. 4A shows an example of one possible drill bit design to obtain an uninterrupted coverage by the cutters 50 across the rock face to be drilled. In practice, a large number of cutters 50 (86 cutters in the case of FIG. 4A) is needed to obtain such uninterrupted coverage across the contact face of the drill bit.

FIG. 4A shows a contour 80 which represents schematically a contact face of the drill bit 10 as is defined by, for example, the plurality of blades 20 of a fixed cutter drill bit. In the image of FIG. 4A, the contour 80 represents a common contact face which describes the contact face across the ridgeline of each of the blades 20, and which would describe a surface of revolution, if rotated around the axis 82, equivalent to the surface of revolution defined by rotating the blades 20 of drill bit 10 of, for example, FIGS. 1 and 2.

In FIG. 4A, the contour 80 thus represents a common contact face for all of the blades 20. Superimposed on top of the contour 80 are the positions of all of a plurality of cutters 50 for the entire drill bit 10. In practice, the cutters 50 will be distributed across the multiple blades 20 of the drill bit 10. However, in FIG. 4A, the cutters 50 are all shown as though positioned on a single blade, with their edges shown overlapping and superimposed on top of one another, so that the distribution of the cutters 50 across the contact face of the drill bit 10 can be appreciated. In this way, it is possible to see how the cutters 50 on the different blades 20 cooperate to ensure a complete coverage of the rock face which is to be cut by rotation of the drill bit 10.

As shown in FIG. 4A, the contour 80, representing a ridgeline of the blade 20, defines a gauge portion corresponding to the radially outermost section of the drill bit 10, which extends forward into a shoulder portion that curves radially inwardly from the gauge portion. A nose portion represents the forward-most extent of the blades 20 and the contact face, radially inside the shoulder portion. The contour 80 then extends radially inward and axially backwards from the nose portion, to define the inner cone, which is the portion of the contour 80 located closest to the axis of rotation 82.

Whilst FIG. 4A represents a realistic drill bit design that can readily be manipulated in a CAD programme, the large number of cutters disposed in overlapping relationship makes the individual features less easy to discern and appreciate for present purposes.

Accordingly, further discussion will be made with reference to FIG. 4B, which the reader will appreciate is a simplified example of a design similar to that of FIG. 4A.

Figure 4B:
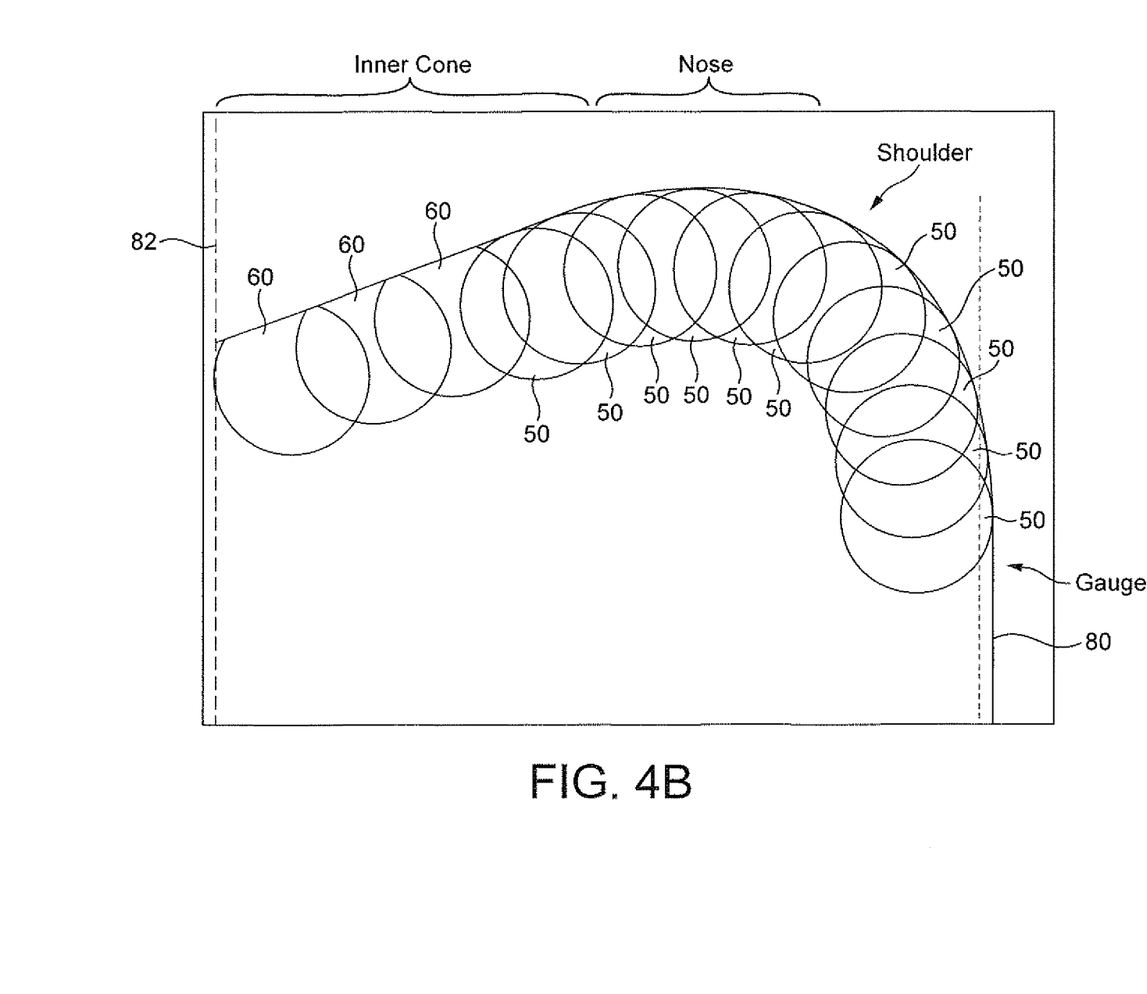
FIG. 4B shows a simplified schematic illustration, similar to FIG. 4A, of the distribution of a mixture of sharp and dull cutters across the contact face of a drill bit, where one contour representative of the blade geometry at the contact face has a plurality of, but (for clarity) not all, cutters from different blades super-imposed on top of one another to show how the different types of cutters may be arranged to be distributed across the cutting face.

To this end, FIG. 4B shows an example of one possible drill bit design utilising a mixture of dull cutters 60 and sharp cutters 50 in order to obtain an uninterrupted coverage by the cutters 50 and 60 across the rock face to be drilled. In practice, a large number of cutters 50 and 60 is still needed to obtain uninterrupted coverage across the contact face of the drill bit, but here the number of such cutters has been reduced in order to permit the remaining features of FIG. 4B to be more easily viewed.

FIG. 4B similarly shows a contour 80 which represents schematically a contact face of the drill bit 10 as is defined by, for example, the plurality of blades 20 of a fixed cutter drill bit. In the image of FIG. 4B, the contour 80 represents a common contact face which describes the contact face across the ridgeline of each of the blades 20, and which would describe a surface of revolution, if rotated around the axis 82, equivalent to the surface of revolution defined by rotating the blades 20 of drill bit 10 of, for example, FIGS. 1 and 2.

In FIG. 4B, the contour 80 thus represents a common contact face for all of the blades 20. Superimposed on top of the contour 80 are the positions of all of a plurality of cutters 50 and 60 for the entire drill bit 10. In practice, the cutters 50 and 60 will be distributed across the multiple blades 20 of the drill bit 10. However, in FIG. 4B, the cutters 50 and 60 are all shown as though positioned on a single blade, with their edges shown overlapping and superimposed on top of one another, so that the distribution of the cutters 50 and 60 across the contact face of the drill bit 10 can be appreciated. In this way, it is possible to see how the cutters 50 and 60 on the different blades 20 cooperate to ensure a complete coverage of the rock face which is to be cut by rotation of the drill bit 10, although it will be appreciated that a practical drill bit design of this form may include many more cutters, similarly as for FIG. 4A.

As also shown in FIG. 4B, the contour 80, representing a ridgeline of the blade 20, again defines a gauge portion corresponding to the radially outermost section of the drill bit 10, which extends forward into a shoulder portion that curves radially inwardly from the gauge portion. A nose portion represents the forward-most extent of the blades 20 and the contact face, radially inside the shoulder portion. The contour 80 then extends radially inward and axially backwards from the nose portion, to define the inner cone, which is the portion of the contour 80 located closest to the axis of rotation 82.

In FIG. 4B, the sharp cutters 50 are indicated by complete circles, whilst the dull cutters 60 are indicated by circles from which a circular segment has been removed along a chord line, such that the cutting faces of the dull cutters 60 are indicated by the chord line. These shapes do not necessarily correspond to the actual cross-sectional shapes of the cutters 60 or their cutting faces, in particular when viewed in a plane which includes the axis of rotation 82 as in FIG. 4B and noting that the cutters will typically be disposed at an inclined cutting angle relative to such a plane, but merely indicate the orientation of the cutting edges of the cutters relative to such a plane. As can be seen, in the embodiment of FIG. 4B, the dull cutters 60 are formed so as to have the cutting edges, and correspondingly the substantially flat surfaces 62 of each of the cutters 60, aligned along the contour 80 representing the contact face. That is to say, the cutters 60 are oriented so that the substantially flat surfaces 62 face the contact face of the drill bit 10. As an alternative, in order to provide an increased resistance to the applied weight on bit, the cutters 60 could be oriented so as to have the substantially flat surfaces 62 facing in a direction parallel to the axis 82, thereby directly resisting the axial weight on bit.

As can be seen, in the embodiment of FIG. 4B, the dull cutters 60 are provided only within the inner cone of the contact face, with the remaining cutters being provided as sharp cutters 50. However, this arrangement is purely exemplary, and the dull cutters may be provided throughout any or all of the inner cone, nose and shoulder portions, and may additionally also be provided in the gauge portion, if desired.

By using a mixture of sharp cutters 50 and dull cutters 60, the behaviour and characteristics of the drill bit 10 can be adjusted, as will be appropriate for different types of rock formation.

In particular, it is possible to provide a mixture of sharp cutters 50 and dull cutters 60 throughout the inner cone, nose and shoulder portions of the contact face, for example in order to provide a balance between the steerability and stability of the drill bit 10 and the rate of penetration (ROP) of the drill bit 10 into the rock formation. Equally, or in addition thereto, it is possible to change or vary the degree to which the dull cutters 60 are blunted. That is to say that, the dull grade of the dull cutters 60 can be varied by changing the sizes of the substantially flat surfaces 62.

Figure 5:
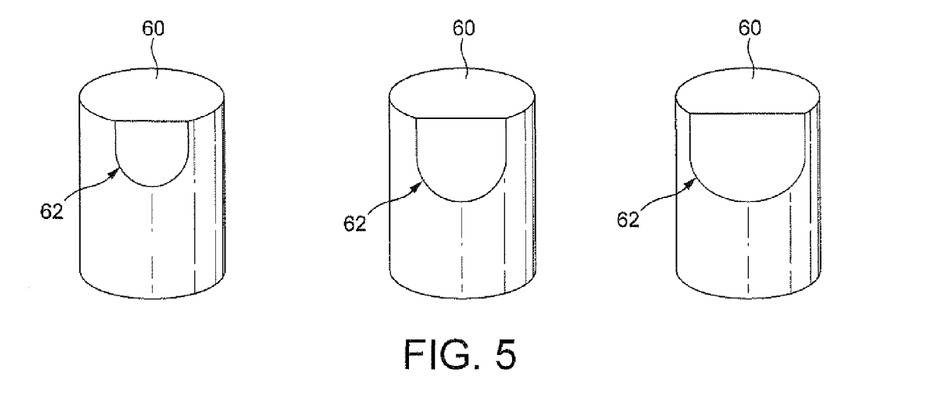
FIG. 5 shows a plurality of dull cutters, each being formed to have a substantially flat surface formed on one side thereof which intersects with the cutting face of each cutter to define a cutting edge, and illustrating how the flat faces of each of the three cutters has a different surface area.

Referring to FIG. 5, there is shown an example of three different dull cutters 60, each having respective substantially flat surfaces 62 formed on one side thereof. The substantially flat surfaces 62 are all formed to be of different sizes, increasing in size from left to right. In this way, the length of the cutting edge of each of the cutters increases from the left cutter to the right cutter as shown in FIG. 5, such that the cutter on the left is the sharpest, with the cutter on the right being the dullest.

As well as varying the size of the substantially flat surfaces 62, the aggressiveness of the cutters can also be varied, in order to achieved a desired balance between the sharpness and the aggressiveness of the cutters. Typically, the substantially flat surfaces 62 will be oriented relative to the cutting face of each cutter 60, so as to maintain the orientation of the substantially flat surface 62 parallel to the contact face of the drill bit 10. In this way, the angle of inclination of the substantially flat surface 62 relative to the cutting face of the cutter 60 will change, as between the cutters 60, according to their respective aggressiveness, i.e., the angle of disposition of the cutter 60 on the drill bit 10 with respect to the contact face and the associated cutting direction of the cutter 60 as the drill bit 10 is rotated.

Referring again to FIGS. 4A and 4B, it can be seen how fewer cutters 50 and 60 are provided in the inner cone region, in particular in the region closest to the axis 82, with the cutters 50 and 60 in this region having the least amount of overlap. As will be appreciated with reference to FIGS. 1 and 2, this results from the lack of available surface area at the innermost portion of the contact face, such that, typically, only two blades 20 can be provided in this region.

Accordingly, fewer cutters 50 and 60 can be provided, carried on the blades 20, in this region of the contact face (tool face). The result is that the cutters in the inner cone, in addition to having the slowest cutting speed, due to having the radially innermost position, are also likely to have the highest specific loading of the cutters on the drill bit 10, as there are fewer cutters between which to share the task of cutting the volume of rock needed to achieve the desired rate of penetration (ROP). This may explain why the steerability and stability of steerable drill bits is particularly sensitive to the behaviour of the cutting teeth (cutters) in the inner cone. The design of the distribution of the sharp cutters 50 and dull cutters 60 can be correspondingly adapted to take account of this behaviour, for example by providing the most dull cutters 60 in the central region of the cutting face, specifically in the inner cone. The cutters in this portion of the contact face may also be mounted, or otherwise be provided, with associated DOCC features, so as to have a reduced, limited depth of cut as compared with the cutters in the nose, shoulder or gauge portions of the drill bit 10.

In this way, the design of the drill bit 10, and the disposition of the cutters 50 and 60 at the contact face, can be readily adapted in order to suit the type of formation being drilled, in particular to provide steerability and steering stability, reduced sensitivity to weight on bit fluctuations, and the necessary rate of penetration. At the same time, as the dull cutters 60 also provide resistance to increased depth of cut, the surface area of the contact face which must be dedicated to the provision of DOCC features can be reduced, allowing a greater freedom in the design of the drill bit, and in particular allowing a substantially free hydraulic design for the nozzles 40 and junk slots 30, to ensure that all the formation cuttings can be carried away from the contact face and the drill bit 10. In this way, the chances of bit balling can be minimised.

Figure 6:
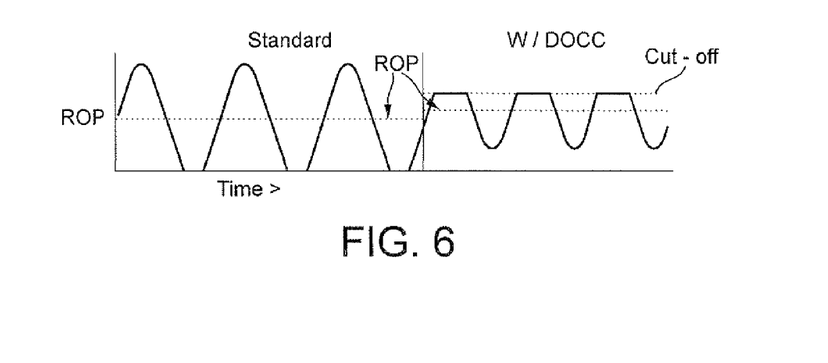
FIG. 6 illustrates graphically how the use of one or more features to control or limit the depth-of-cut of the cutters can dampen or reduce the vibrational response of the drill bit to axial vibrations.

Another benefit of the use of dull cutters 60 and minimising the responsiveness of the drill bit 10 to variations in the weight on bit is to reduce the sensitivity of the drill bit 10 to axial vibrations. As illustrated in FIG. 6, it can be seen how the use of various depth-of-cut control features, including the substantially flat surfaces 62 of the dull cutter 60, can attenuate the responsiveness of the drill bit 10 to axial longitudinal vibrations. As a result of this, the cutting face of the drill bit 10 can be maintained in more constant contact with the rock surface to be drilled, allowing a substantially more constant and potentially higher average rate of progress to be maintained.

From reading the foregoing, the skilled person will readily understand how the use of pre-formed dull cutters 60 can be used in cooperation with other design elements in order to optimise the design of a drill bit 10 for drilling into any particular rock formation. Once a well drilling operation has been planned, and the intended path for the wellbore has been determined, the drill bit designer is able to assess the different types of rock formation which the drill bit 10 is likely to encounter during drilling, as will be identified by the usual pre-drilling surveys. Accordingly, by providing an initial design of a drill bit 10 and its associated cutting structures 50 and 60, the skilled person can adjust the number of the dull cutters and sharp cutters 50, respectively, as well as adjusting their individual and mutual aggressiveness, and the dull grading of each of the dull cutters 60. In combination with this, the skilled person can adapt the position of the cutters on the contact face, and may even adapt the shape of the contour of the cutting face to suit the particular selection of cutters 50 and 60 and the rock formation being drilled. In addition to this, the skilled person may still make use of all types of known depth-of-cut control features, in combination with the use of dull cutters 60, in order to arrive at an optimised design solution for a particular wellbore in a particular formation.

The drill bits 10 of the present invention are particularly suitable for directional drilling applications. In applications where the planned dog-leg severity (DLS) is high, and/or where bottom hole assembly (BHA) hanging issues (where the drill string catches on the sidewall of the wellbore so that the BHA hangs without the full weight-on-bit being applied to it), the use of dull cutters 60 can be particularly advantageous, and in these cases the cutters (60) can be ground to have the largest possible cutting edges and substantially flat surfaces 62. Equally, the embodiments of the present invention may be particularly useful where soft rock formations are being drilled, since the substantially flat surfaces 62 act as bearing surfaces and can, in combination with further depth-of-cut control (DOCC) features, serve to resist the tendency of the weight on bit to exceed the compressive rock strength for the formation being drilled.

It is expected that in any design method for designing such drill bits 10, the skilled person will utilise a computerised optimisation routine, in order to vary and adjust the size, disposition, orientation and dull grading, as well as the number and position, of the dull cutters 60 provided to the drill bit 10. This variation in the drill bit design is in addition to the other known design features which can, of course, also be varied simultaneously or in tandem with changes to the dull cutter 60 arrangement.

One unique feature of the use of pre-formed dull cutters 60 is that the torque response of the drill bit 10 will be affected by the provision of the substantially flat surfaces 62. In particular, the reactive torque acting on a drill bit is a combination of the cutting forces (i.e., the forces needed to removed a particular volume of rock) and the frictional forces (i.e. the drag forces exhibited when the contact face slides over the rock face being drilled). In the case of dull cutters 60, the reactive torque has to be calculated in order to take account of the surface area of the substantially flat surfaces 62, which contribute to the frictional forces. At the same time, the dull cutters 60 have less sharp cutting edges, and so will typically remove a smaller volume of rock, thereby reducing the associated cutting force. Yet, for a known type, the behaviour of these cutters for known angles of aggressiveness is well-known or can easily be determined from routine testing. In this way, it is possible to determine the resultant behaviour of the drill bit 10, at least to a certain approximation, simply from a calculation of the total surface area of the substantially flat surfaces 62. In this way, the surface area for the individual substantially flat surfaces 62 of the dull cutters 60, as well as the total surface area of the substantially flat surfaces 62, may be used as design variables or output characteristics in the design method, for example in a computerised optimisation routine.

In order to provide the dull cutters 60, it is contemplated simply to start with fully cylindrical sharp cutters 50, and to machine these cutters to form the dull cutters 60. Specifically, it is intended that the dull cutters 60 can be formed by grinding sharp cutters 50 so as to form the substantially flat surfaces 62 at a desired orientation on one side of the cutter. Other machining techniques would also be available for forming the substantially flat surfaces 62 from sharp cutters 50, for example by cutting the cutters 50 using electrical discharge machining (EDM).

As an alternative, however, it is also contemplated that used or worn cutters may be scavenged from used drill bits, in which the originally-provided sharp cutters 50 have been worn down by abrasion against the rock face which they have been used to drill. In this case, the worn or damaged cutters from used drill bits may be collected and graded according to the level of dull grading to which they have already succumbed. With appropriate sorting and selection of the scavenged dull cutters, these dull cutters 60 may be appropriately selected for use on a newly-formed drill bit 10 in accordance with the teaching of the present invention. Equally, in order to provide a better match for the desired performance characteristics, the scavenged dull cutters may also be repaired or renewed by machining them, for example, by grinding or EDM, or the like, to provide new substantially flat surfaces 62 and defined cutting edges, by removing further material in the region where the cutter has already become worn through abrasion or otherwise damaged.

Many variations and alternatives to the designs shown in the illustrated embodiments will become apparent to the skilled person from reading the present disclosure. The present invention is not limited by the presently disclosed embodiments, and is defined in the accompanying claims.

For example, although the embodiments of FIGS. 1 and 2 both show drill bits having only a single row of cutters on each blade, the skilled reader will readily understand that the foregoing description is equally applicable to drill bits having two or more rows of cutters on each blade, formed as primary and secondary cutting structures. Drill bits having multiple rows of cutters on each blade are well known to the person of ordinary skill in the present technical field. The dull cutters having substantially flat surfaces formed on them to define the cutting edges of the cutters can be provided, in such cases, in either or both of the primary and secondary cutting structures.

The invention claimed is:

1. A drill bit for drilling a wellbore in a subterranean formation, the drill bit comprising:
   a bit body having a first blade and a second blade, the first blade extending from a gauge portion to an inner cone portion of the drill bit and the second blade extending from the gauge portion to a nose portion of the drill bit;
   a cylindrical cutter disposed on the first and second blades; and
   a first truncated cylindrical cutter disposed on the inner cone portion of the first blade, the first truncated cylindrical cutter machined to form a substantially flat surface at a cutting face of the first truncated cylindrical cutter, a size of the substantially flat surface selected such that, during a drilling operation, a steady rate of progression is maintained during fluctuations of a weight on bit.

2. The drill bit of claim 1, wherein the first truncated cylindrical cutter is located in a central region of a contact face of the drill bit adjacent to where the axis of rotation passes through the contact face.

3. The drill bit of claim 1, wherein:
   a shoulder portion of the first blade extends forward in the direction of the axis from the radially outermost gauge portion of the drill bit to define a forward-most nose portion of the first blade, with the inner cone portion extending backward from the nose portion.

4. The drill bit of claim 3, wherein a second truncated cylindrical cutter is located in at least the nose portion or the shoulder portion of the first blade and is machined to form a substantially flat surface which defines a cutting edge of a cutting face of the second truncated cylindrical cutter.

5. The drill bit of claim 1, wherein the first-truncated cylindrical cutter is mounted on the drill bit with the substantially flat surface facing substantially in a forward drilling direction along the axis of rotation.

6. The drill bit of claim 1, wherein the first truncated cylindrical cutter is mounted on the drill bit with the substantially flat surface lying substantially parallel to a contact face of the drill bit.

7. The drill bit of claim 1, wherein the substantially flat surface of the first truncated cylindrical cutter locally defines a contact face of the drill bit.

8. The drill bit of claim 1, wherein the substantially flat surface of the first truncated cylindrical cutter is arranged to act as a bearing surface to control a depth of cut of the first truncated cylindrical cutter in a subterranean rock formation during drilling of the wellbore.

9. The drill bit of claim 1, wherein the substantially flat surface of the first truncated cylindrical cutter and a substantially flat surface of a second truncated cylindrical cutter are each machined to intersect with the cutting face of the first truncated cylindrical cutter and a cutting face of the second truncated cylindrical cutter, respectively, and define the cutting edges of the cutting faces of the first and second truncated cylindrical cutters.

10. The drill bit of claim 9, wherein the substantially flat surfaces of the first and second truncated cylindrical cutters are arranged so as to cooperate to act as a bearing surface to control a depth of cut of the first and second truncated cylindrical cutters in a subterranean rock formation during drilling of the wellbore.

11. The drill bit of claim 9, wherein the substantially flat surfaces of the first and second truncated cylindrical cutters are formed at different angles of inclination relative to the respective cutting faces of the first and second truncated cylindrical cutters.

12. The drill bit of claim 9, wherein the substantially flat surfaces of the first and second truncated cylindrical cutters have different surface areas.

13. The drill bit of claim 1, wherein the cylindrical cutter is located inside the gauge portion of a contact face and is formed without a machined substantially flat surface defining a cutting edge of a cutting face of the cylindrical cutter.

14. The drill bit of claim 1, wherein the first truncated cylindrical cutter is disposed at a contact face as part of one or both of a primary cutting structure and a secondary cutting structure.

15. A method of designing a drill bit for drilling a wellbore in a subterranean formation comprising:
   specifying at least one contour corresponding to a first contact surface of the drill bit and having a rotational axis of the drill bit passing therethrough, the first contact surface extending from a gauge portion to an inner cone portion of the drill bit;
   specifying at least one contour corresponding to a second contact surface of the drill bit and having the rotational axis of the drill bit passing therethrough, the second contact surface extending from the gauge portion to a nose portion of the drill bit;
   specifying a disposition of a first truncated cylindrical cutter at the first contact surface and a cylindrical cutter at the second contact surface, the first truncated cylindrical cutter is formed with a substantially flat surface which intersects with a cutting face of the first truncated cylindrical cutter and defines a cutting edge of the cutting face of the first truncated cylindrical cutter, a size of the substantially flat surface selected such that, during a drilling operation, a steady rate of progression is maintained during fluctuations of a weight on bit;

calculating a reactive torque that acts on the drill bit at one or more points along a path of the drill bit when drilling the wellbore based on a surface area of the substantially flat surface or a length of the cutting edge of the first truncated cylindrical cutter;

determining a location on the inner cone portion of the drill bit for the first truncated cylindrical cutter based on the reactive torque;

determining a location on the nose portion of the drill bit for the cylindrical cutter; and adapting the disposition of the first truncated cylindrical cutter and the cylindrical cutter at the first and second contact surfaces based on the reactive torque.

16. The method of claim 15, wherein the first truncated cylindrical cutter is located in a central region of the first contact surface adjacent to where the rotational axis passes through the first contact surface.

17. The method of claim 15, wherein the orientation of the substantially flat surface is substantially parallel to the first contact surface of the drill bit or facing substantially in a forward drilling direction along the rotational axis.

18. The method of claim 15, wherein the substantially flat surface of the first truncated cylindrical cutter and a substantially flat surface of a second truncated cylindrical cutter are each formed with substantially flat surfaces which intersect with the first cutting face of the first truncated cylindrical cutter and a third cutting face of the second truncated cylindrical cutter, respectively, and define cutting edges of the first and third cutting faces of the first and second truncated cylindrical cutters.

19. The method of claim 15, further comprising providing formation characteristics data corresponding to the formation in which the wellbore is to be drilled, wherein the formation characteristics data includes at least the compressive rock strength of the formation at the one or more points along the path of the drill bit when drilling the wellbore.

20. The method of claim 19, wherein the formation characteristics data is used to determine a depth of cut for the first truncated cylindrical cutter and the cylindrical cutter at the one or more points along the wellbore.

21. The method of claim 18, further comprising increasing the surface area of the substantially flat surface of at least one of the first and second truncated cylindrical cutters formed with the substantially flat surface if the depth of cut is determined to exceed a maximum value specified for the depth of cut for at least one of first and second truncated cylindrical cutters at the one or more points along the wellbore.

22. The method of claim 15, further comprising specifying one or more parameters selected from the group consisting of:
a surface area of the substantially flat surface of the first truncated cylindrical cutter;
a total surface area of all of the substantially flat surfaces of the first truncated cylindrical cutter;
an angle of inclination of the substantially flat surface relative to the cutting face of the first truncated cylindrical cutter;
an angle of the cutting face of the first truncated cylindrical cutter relative to the cutting direction of the at least one of the cutters as the drill bit rotates about the rotational axis;
an orientation of the substantially flat surface of the first truncated cylindrical cutter relative to the axially forward direction of the drill bit;
a dull grading value indicative of the relative sharpness of the cutting edge of the first truncated cylindrical cutter;
a number of the first truncated cylindrical cutter; and
a position of the first truncated cylindrical cutter at the first contact surface.

23. The method of claim 22, further comprising adjusting at least one of the one or more parameters and comparing a value indicative of at least one performance characteristic of an adjusted drill bit design and an unadjusted drill bit design.

24. The method of claim 23, wherein the at least one performance characteristic is selected from the group consisting of:
a reactive torque on bit generated at the one or more points along the path of the drill bit when drilling the wellbore;
a rate of penetration of the drill bit into the formation at the one or more points along the path of the drill bit when drilling the wellbore;
a ratio of torque-on-bit to weight-on-bit at the one or more points along the path of the drill bit when drilling the wellbore; and
a variation of torque-on-bit with changes in the apparent weight-on-bit at the one or more points along the path of the drill bit when drilling the wellbore.

25. The method of claim 15, wherein the method comprises simulating drilling the wellbore in the subterranean formation using a drill bit design.

26. A method of manufacturing a drill bit comprising:
forming a bit body having a contact face of the drill bit including a gauge portion and an axis of rotation of the drill bit passing through the contact face of the drill bit;
forming a first blade to the bit body, the first blade extending from the gauge portion to an inner cone portion of the drill bit;
forming a second blade to the bit body, the second blade extending from the gauge portion to a nose portion of the drill bit;
mounting a cylindrical cutter to the second blade at the contact face;
mounting a first truncated cylindrical cutter to the first blade at the contact face, the first truncated cylindrical cutter having a substantially flat surface which intersects with a cutting face of the first truncated cylindrical cutter and defines a cutting edge of the cutting face of the first truncated cylindrical cutter, the first truncated cylindrical cutter machined to form the substantially flat surface, a size of the substantially flat surface selected such that, during a drilling operation, a steady rate of progression is maintained during fluctuations of a weight on bit.

27. The method of claim 26, wherein the substantially flat surface is formed by removing material from an original super-abrasive cutter prior to mounting the first truncated cylindrical cutter to the bit body.

28. The method of claim 27, wherein the super-abrasive cutter is a dull cutter which has been worn by use to form the substantially flat surface, or the material has been removed by machining the original super-abrasive cutter by grinding or cutting.

29. The method of claim 26, further comprising machining an original cutter to form the first truncated cylindrical cutter having the substantially flat surface prior to mounting the first truncated cylindrical cutter to the first blade.

30. The method of claim 26, further comprising selecting a dull cutter as the first truncated cylindrical cutter and mounting the selected dull cutter to the first blade.

* * * * *